United States Patent [19]
Sugiyama et al.

[11] Patent Number: 5,334,555
[45] Date of Patent: Aug. 2, 1994

[54] METHOD OF DETERMINING CONDITIONS FOR PLASMA SILICON NITRIDE FILM GROWTH AND METHOD OF MANUFACTURING SEMICONDUCTOR DEVICE

[75] Inventors: Toshinobu Sugiyama; Hiroshi Sakurai, both of Kanagawa, Japan

[73] Assignee: Sony Corporation, Tokyo, Japan

[21] Appl. No.: 972,962

[22] Filed: Nov. 6, 1992

[30] Foreign Application Priority Data

Nov. 6, 1991 [JP] Japan ................... 3-290114

[51] Int. Cl.$^5$ ............ H01L 21/00; H01L 21/02; H01L 21/302; H01L 21/463
[52] U.S. Cl. ........................ 437/241; 437/235
[58] Field of Search ................... 437/235, 241

[56] References Cited

U.S. PATENT DOCUMENTS

5,010,024  4/1991  Allen et al. ................ 437/24

Primary Examiner—R. Bruce Breneman
Assistant Examiner—B. Everhart
Attorney, Agent, or Firm—Hill, Steadman & Simpson

[57] ABSTRACT

A silicon nitride film is deposited on a semiconductor substrate in a plasma generated with $SiH_4$ and nitride gases by the application of high-frequency electric energy. An allowable range of ultraviolet radiation absorption rates of the silicon nitride film, and also an allowable range of inner stresses of the silicon nitride film are established. Levels of both the flow rate of the $SiH_4$ gas and the high-frequency electric energy are determined so that the silicon nitride film will satisfy the allowable range of ultraviolet radiation absorption rates with a wide margin and the allowable range of inner stresses with a wide margin.

13 Claims, 6 Drawing Sheets

METHOD OF DETERMINING CONDITIONS FOR PLASMA SILICON NITRIDE FILM GROWTH AND METHOD OF MANUFACTURING SEMICONDUCTOR DEVICE

BACKGROUND OF THE INVENTION

1. Field of the Invention

The present invention relates to a method of determining conditions for the growth of a plasma silicon nitride (SiN) film for use as an overcoat layer in a semiconductor device, especially a semiconductor memory such as an ultraviolet erasable programmable read-only memory (UV erasable PROM) or the like, and a method of manufacturing a semiconductor device having an overcoat layer in the form of a plasma SiN film, using such a method of determining conditions.

2. Description of the Prior Art

Figure 1:
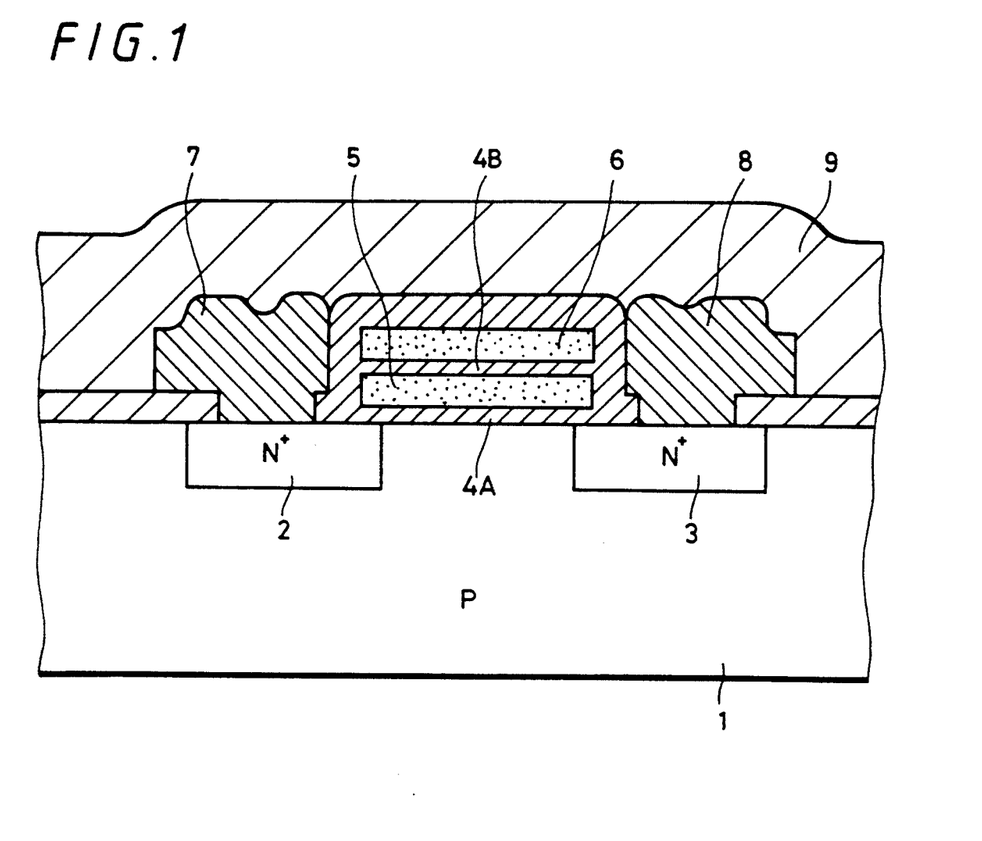
FIG. 1 is a fragmentary cross-sectional view of a UV erasable PROM.

One ultraviolet erasable programmable read-only memory (UV erasable PROM) is shown in FIG. 1 of the accompanying drawings. As shown in FIG. 1, the ultraviolet erasable programmable read-only memory has a semiconductor substrate 1 of a first conductivity type, e.g., P type, with spaced source and drain regions 2, 3 of a second conductivity type, e.g., N type, being formed in one surface of the semiconductor substrate 1. A floating gate 5 is disposed partly over and extends between the source and drain regions 2, 3 with an insulation film 4A interposed therebetween. A control gate 6 is disposed over the floating gate 5 with an insulation film 4B interposed therebetween. Electrodes 7, 8 are deposited respectively on the source and drain regions 2, 3. An overcoat layer 9 is deposited on the surface formed so far. Usually, the overcoat layer 9 comprises a silicon nitride (SiN) film formed by plasma chemical vapor deposition (CVD).

Figure 2:
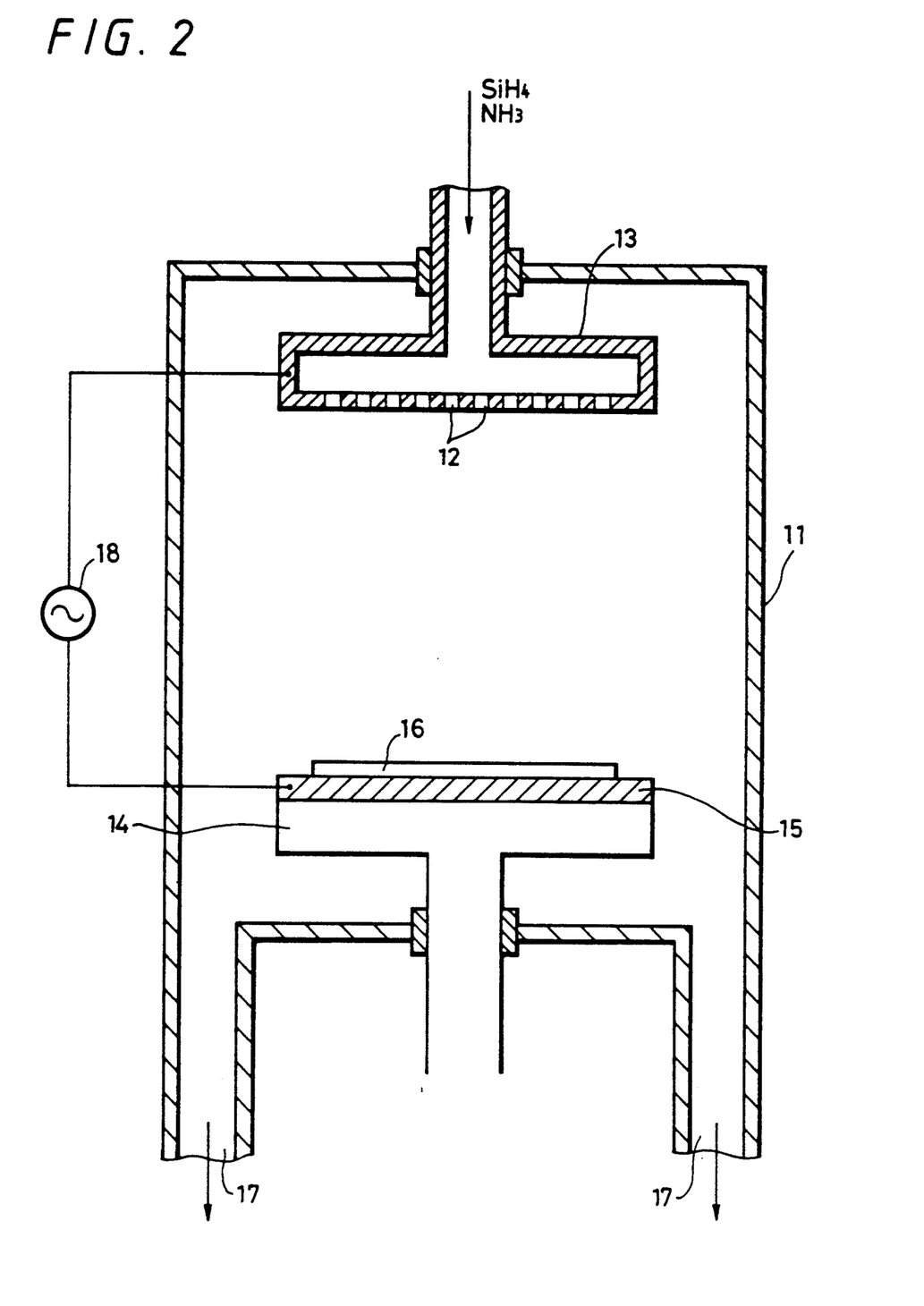
FIG. 2 is a cross-sectional view of a plasma CVD apparatus.

As shown in FIG. 2 of the accompanying drawings, a plasma CVD apparatus comprises a chamber 11 housing an upper electrode 13 which has gas nozzles 12 for supplying raw material gases of $SiH_4$, $NH_3$, and a heater 14 positioned below the upper electrode 13 in confronting relationship thereto. A semiconductor wafer 16, on which a desired plasma silicon nitride film is to be deposited, is placed on the heater 14 through a susceptor 15 doubling as a lower electrode. In operation, a high-frequency electric energy is applied between the upper electrode 13 and the susceptor 15 by a high-frequency power supply 18, and the raw material gases are introduced into the chamber 11 through the gas nozzles 12. As a result, an SiN film is formed on the semiconductor wafer 16 by plasma chemical reaction, i.e., plasma CVD. The chamber 11 has discharge ports 17 opening downwardly.

The plasma SiN film thus formed, which is used as the overcoat layer 9 of the UV erasable PROM, is required to have a high ultraviolet radiation transmittance for erasing any stored data, unlike other semiconductor devices. To meet such a requirement, it is necessary to reduce the number of Si—H bonds in the SiN film.

Normally, the number of Si—H bonds can be reduced if the flow rate of $SiH_4$ is reduced. However, if the flow rate of $SiH_4$ is reduced, then the internal stress of the SiN film is increased. Consequently, it is difficult to determine conditions with a margin for increasing the ultraviolet radiation transmittance and also maintaining a film stress in a range low enough to be free of reliability problems, simply by controlling the parameter of the $SiH_4$ flow rate.

OBJECTS AND SUMMARY OF THE INVENTION

It is therefore an object of the present invention to provide a method of determining conditions for the growth of a plasma SiN film to achieve a desired ultraviolet radiation transmittance and also a desired film stress level.

Another object of the present invention is to provide a method of manufacturing a semiconductor device, e.g., an ultraviolet erasable programmable read-only memory, having an overcoat layer in the form of a plasma SiN film, using such a method of determining conditions.

According to the present invention, there is provided a method of determining conditions for the growth of a silicon nitride film in a plasma generated with $SiH_4$ and nitride gases by the application of high-frequency electric energy, comprising the steps of establishing an allowable range of ultraviolet radiation absorption rates of the silicon nitride film, establishing an allowable range of inner stresses of the silicon nitride film, and determining levels of both the flow rate of the $SiH_4$ gas and the high-frequency electric energy to cause the silicon nitride film to satisfy the allowable range of ultraviolet radiation absorption rates and the allowable range of inner stresses.

According to the present invention, there is also provided a method of manufacturing a semiconductor device having an overcoat layer in the form of a silicon nitride film in a plasma generated with $SiH_4$ and nitride gases by the application of high-frequency electric energy, comprising the steps of establishing an allowable range of ultraviolet radiation absorption rates of the silicon nitride film, establishing an allowable range of inner stresses of the silicon nitride film, determining levels of both the flow rate of the $SiH_4$ gas and the high-frequency electric energy to cause the silicon nitride film to satisfy the allowable range of ultraviolet radiation absorption rates and the allowable range of inner stresses, and supplying the $SiH_4$ gas at the determined flow rate and applying the high-frequency electric power at the determined level to generate a plasma for forming the silicon nitride film therein.

The allowable range of inner or internal stresses may be from $-3.0 \times 10^9$ to $-7.0 - 10^9$ dyn/cm$^2$. The allowable range of ultraviolet radiation absorption rates may be at most 0.7 abs/1000Å at most.

The levels of both the flow rate of the $SiH_4$ gas and the high-frequency electric energy may be determined to cause the silicon nitride film to satisfy the allowable range of ultraviolet radiation absorption rates with a wide margin and the allowable range of inner stresses with a wide margin.

The above and other objects, features, and advantages of the present invention will become apparent from the following description of an illustrative embodiment thereof to be read in conjunction with the accompanying drawings, in which like reference numerals represent the same or similar objects.

DETAILED DESCRIPTION OF THE PREFERRED EMBODIMENT

In the illustrated embodiment, the principles of the present invention are applied to a method of determining conditions for the growth of a plasma SiN film for use as an overcoat layer in a UV erasable PROM.

Figure 3:
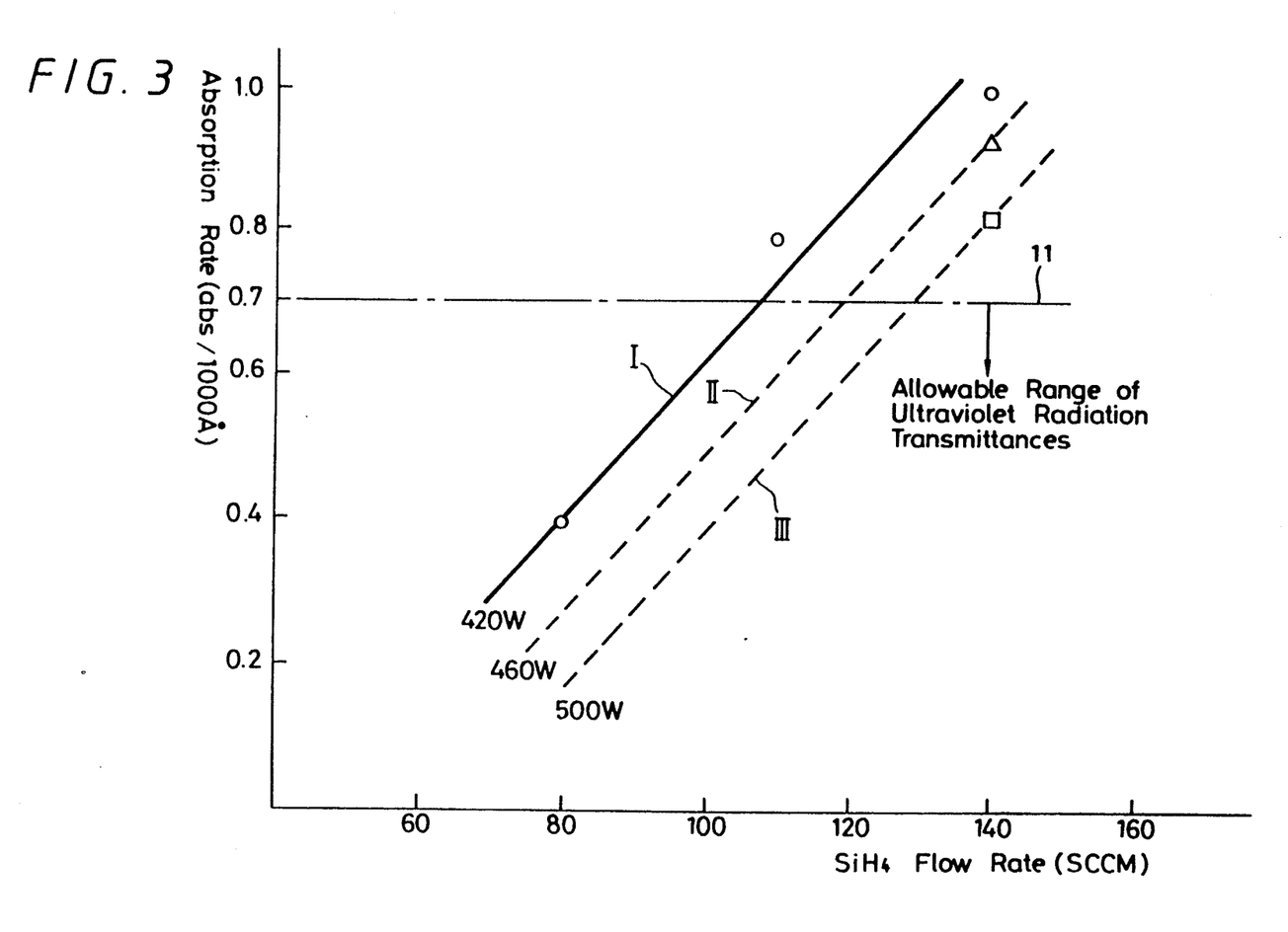
FIG. 3 is a graph showing the relationship between the flow rate of SiH4 and the absorption rate of Si—H bonds at the time a plasma SiN film is formed.

FIG. 3 shows the relationship between the flow rate of SiH4 and the absorption rate of Si—H bonds (proportional to the number of Si—H bonds) as determined by way of the Fourier transform infrared spectroscopy, at the time a plasma SiN film for use as an overcoat layer is formed using the plasma CVD apparatus shown in FIG. 2.

The horizontal axis of the graph of FIG. 3 represents the flow rate of SiH4 (SCCM), and the vertical axis represents the absorption rate (proportional to the absorption rate of ultraviolet radiation by the plasma SiN film, i.e., the UV absorbed dose of the plasma SiN film) of Si—H bonds as standardized in a film thickness of 1000Å. In FIG. 3, a curve I is plotted when the applied high-frequency electric energy is 420 W, a curve II is plotted when the applied high-frequency electric energy is 460 W, and a curve III is plotted when the applied high-frequency electric energy is 500 W. It can be understood from FIG. 3 that the number of Si—H bonds in the SiN film is reduced when the SiH4 flow rate is lowered, and the number of Si—H bonds in the SiN film is reduced also when the applied high-frequency electric energy is increased.

Figure 4:
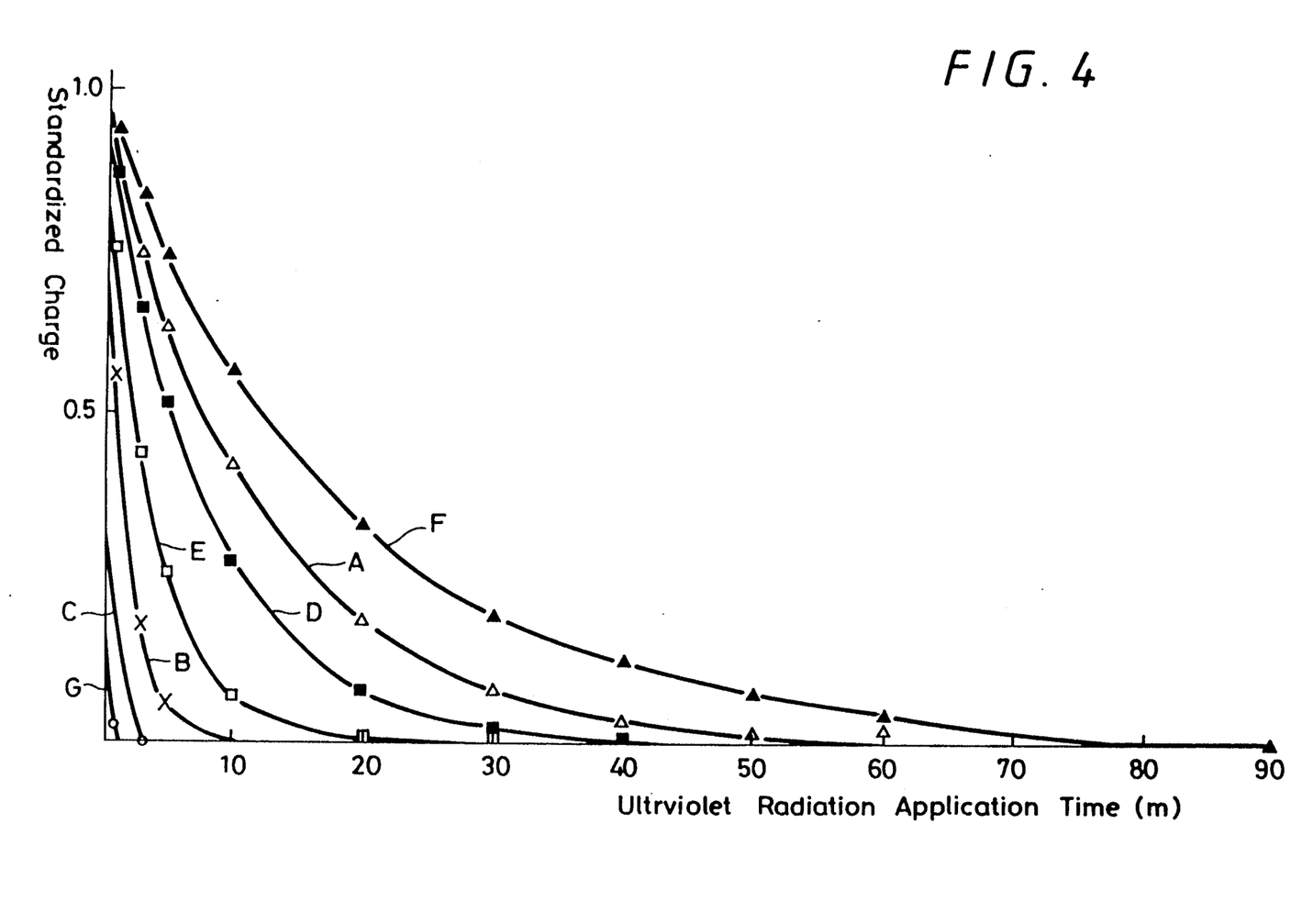
FIG. 4 is a graph showing data erasure characteristics of UV erasable PROMs whose plasma SiN films are formed under the conditions at plot points in FIG. 3.

FIG. 4 shows the relationship between the time in which ultraviolet radiation is applied to erase the stored data from and the erasure (corresponding to the charges in the floating gate of a UV erasable PROM) of the stored data in single transistors of UV erasable PROMs whose plasma SiN films were formed under the conditions at plot points in FIG. 3. Curves A through G in FIG. 4 indicate data erasure characteristics of UV erasable PROMs whose plasma SiN films were formed with SiH4 flow rates and high-frequency electric energies given in the following table:

| | SiH4 flow rate (SCCM) | High-frequency electric energy (W) |
|---|---|---|
| A | 140 | 420 |
| B | 110 | 420 |
| C | 80 | 420 |
| D | 140 | 460 |
| E | 140 | 500 |
| F | Under present high-stress conditions | |
| G | Only PSG film of 7000Å | |

Study of the graph of FIG. 4 shows that the lower the SiH4 flow rate, or the higher the high-frequency electric energy applied, i.e., the fewer the Si—H bonds, the shorter the time required to erase the stored data. This indicates that the Si—H bonds serve as an ultraviolet absorbent, and that the fewer the Si—H bonds, the higher the ultraviolet radiation transmittance.

It is necessary that the erasure of the data stored in an UV erasable PROM in the form of a single transistor be completed within 10 minutes at the latest. In FIG. 4, the conditions of the SiH4 flow rate of 100 SCCM and the high-frequency electric energy of 420 W, indicated by the curve B, are highest within the above allowable period of time. These conditions can be converted into an Si—H bond absorption rate of about 0.7 abs/1000Å (see FIG. 3). In order to meet the allowable ultraviolet radiation transmittance, therefore, the Si—H bond absorption rate should be of 0.7 abs/1000Å or less, i.e., should be in a range below a line 11 in FIG. 3.

Figure 5:
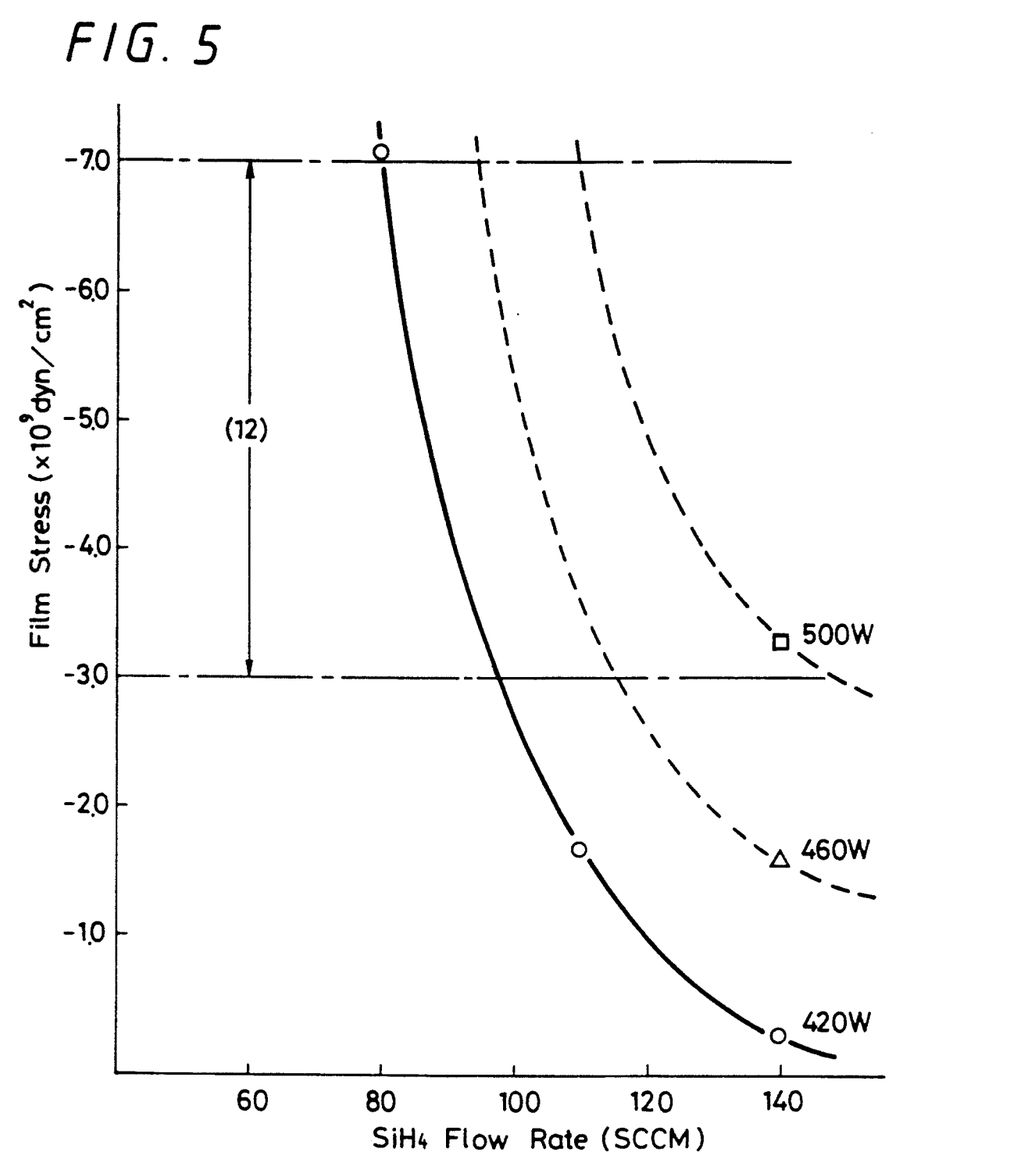
FIG. 5 is a graph showing the relationship between the flow rate of SiH4, the high-frequency electric energy, and the stress on plasma SiN films.

FIG. 5 shows the relationship between the SiH4 flow rate, the high-frequency electric energy, and the stress on plasma SiN films. A reduction in the SiH4 flow rate or an increase in the high-frequency electric energy, i.e., a condition for increasing the ultraviolet radiation transmittance, results in an increase in the internal stress of a plasma SiN film. The results of a reliability test conducted when molded packages of semiconductor chips are assembled have indicated that the internal stress of plasma SiN films has an allowable range from about $-3.0 \times 10^9$ to $-7.0 \times 10^9$ dyn/cm$^2$ as denoted by 12 in FIG. 5.

Figure 6:
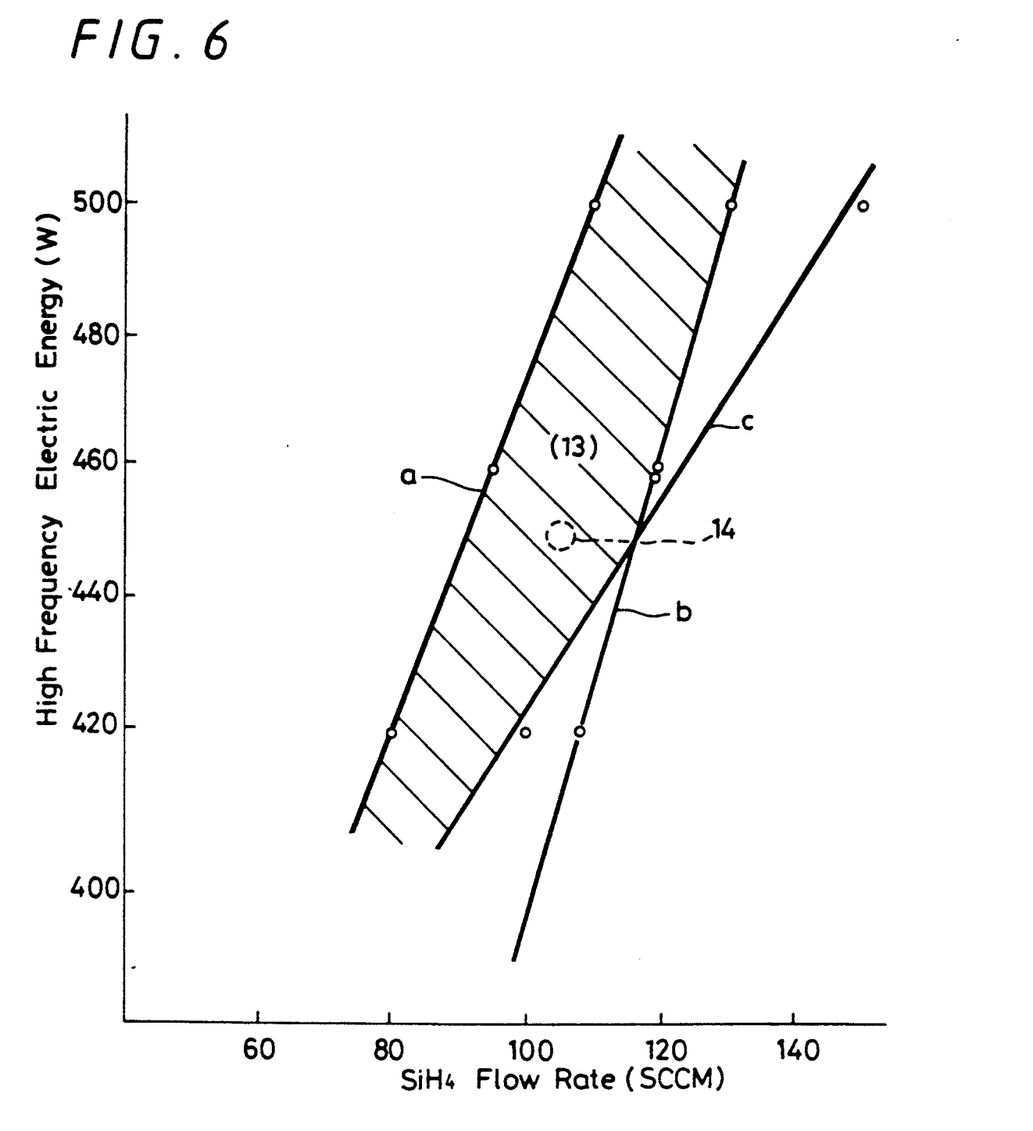
FIG. 6 is a graph showing an allowable range of SiH4 flow rates and high-frequency electric energy levels.

FIG. 6 shows a hatched range 13 in which the SiH4 flow rate and the high-frequency electric energy satisfy the allowable range, below the line 11 (FIG. 3), of ultraviolet radiation transmittances and the allowable range 12 (FIG. 5) of internal stresses of plasma SiN films. In FIG. 6, a line a determined by the upper limit of the allowable film stress range, a line b by the upper limit of the allowable ultraviolet radiation transmittance range, and a line c by the lower limit of the allowable film stress range.

If conditions for the growth of a plasma SiN film were determined by adjusting only one parameter, i.e., the SiH4 flow rate or the high-frequency electric energy, then the determined conditions would have a relatively narrow margin in the manufacturing process. According to the present invention, however, both parameters, i.e., the SiH4 flow rate and the high-frequency electric energy, are taken into account to determine conditions for the growth of a plasma SiN film. The conditions thus determined are typically indicated by a central area 14 (FIG. 6) of the range 13, and provide a wide margin with respect to both the ultraviolet radiation transmittance and the film stress.

To deposit a plasma SiN film as an overcoat layer in the manufacture of a UV erasable PROM using the plasma CVD apparatus, actual levels of the SiH4 flow rate and the high-frequency electric energy are determined as follows:

First, the relationship between the SiH4 flow rate and the absorption rate of Si—H bonds in a plasma SiN film is measured, using the high-frequency electric energy as a parameter, as shown in FIG. 3, to determine the dependency of the ultraviolet radiation absorption rate (the UV absorbed dose of the plasma SiN film) on the SiH4 flow rate. Then, a desired data erasure time is determined from the data erasure characteristics shown in FIG. 4, and limits for the SiH4 flow rate which satisfy the allowable range of ultraviolet radiation transmittances are determined on the basis of the data erasure time.

The dependency of a film stress on the SiH₄ flow rate is measured, using the high-frequency electric energy as a parameter, as shown in FIG. 5. In FIG. 5, the SiH₄ flow rate and the high-frequency electric energy are measured based on the allowable film stress range that has been established from the reliability test on molded packages of semiconductor chips.

Thereafter, levels of the SiH₄ flow rate and the high-frequency electric energy which satisfy the allowable range of ultraviolet radiation absorption rates and the allowable range of film stresses shown in FIG. 6 are found based on the data shown in FIGS. 3 and 5, and the SiH₄ flow rate and the high-frequency electric energy are set to those levels which provide a widest margin.

In a preferred example, the SiH₄ flow rate is set to about 100 SCCM and the high-frequency electric energy is set to about 450 W (see the central area 14 in FIG. 6) for depositing a plasma SiN film. The plasma SiN film thus deposited is excellent for use as an overcoat layer in a UV erasable PROM, and the manufactured UV erasable PROM is highly reliable.

The above embodiment has been described with respect to the deposition of a plasma SiN film for use as an overcoat layer in a UV erasable PROM which will be installed as a molded package on a microcomputer. However, the principles of the present invention are also applicable to general-purpose erasable PROMs. To manufacture such general-purpose erasable PROMs, however, the ultraviolet radiation absorption rate and the film stress have different values than those shown and described in the present embodiment.

With the present invention, since both the SiH₄ flow rate and the high-frequency electric energy are simultaneously adjusted in the growth of a plasma SiN film for use as an overcoat layer, both the ultraviolet radiation absorption rate and the film stress can be set to values with a wide margin in view of the fact that they are subject to variations in the actual manufacturing process.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A method of determining conditions for the growth of a silicon nitride film in a plasma generated with SiH₄ and nitride gases by the application of high-frequency electric energy, comprising the steps of:
    establishing an allowable range of ultraviolet radiation absorption rates of the silicon nitride film;
    establishing an allowable range of inner stresses of the silicon nitride film, said range of inner stresses being from $-3.0 \times 10^9$ to $-7.0 \times 10^9$ dyn/cm²; and
    controlling levels of both the flow rate of the SiH₄ gas and the high-frequency electric energy to cause the silicon nitride film to satisfy said allowable range of ultraviolet radiation absorption rates and said allowable range of inner stresses.

2. A method according to claim 1, wherein said allowable range of ultraviolet radiation absorption rates is at most 0.7 abs/1000Å.

3. A method according to claim 1, further including the step of controlling the levels of both the flow rate of the SiH₄ gas and the high-frequency electric energy to cause the silicon nitride film to satisfy said allowable range of ultraviolet radiation absorption rates with a wide margin and said allowable range of inner stresses with a wide margin.

4. A method of manufacturing a semiconductor device having an overcoat layer in the form of a silicon nitride film in a plasma generated with SiH₄ and nitride gases by the application of high-frequency electric energy, comprising the steps of:
    establishing an allowable range of ultraviolet radiation absorption rates of the silicon nitride film;
    establishing an allowable range of inner stresses of the silicon nitride film; said allowable range of inner stresses being from $-3.0 \times 10^9$ to $-7.0 \times 10^9$ dyn/cm²;
    determining levels of both the flow rate of the SiH₄ gas and the high-frequency electric energy to cause the silicon nitride film to satisfy said allowable range of ultraviolet radiation absorption rates and said allowable range of inner stresses; and
    supplying the SiH₄ gas at the determined flow rate and applying the high-frequency electric power at the determined level to generate a plasma for forming the silicon nitride film therein.

5. A method according to claim 4, wherein said allowable range of ultraviolet radiation absorption rates is at most 0.7 abs/1000Å.

6. A method according to claim 4, further including the step of determining the levels of both the flow rate of the SiH₄ gas and the high-frequency electric energy to cause the silicon nitride film to satisfy said allowable range of ultraviolet radiation absorption rates with a wide margin and said allowable range of inner stresses with a wide margin.

7. A method of determining a condition for forming a plasma silicon nitride film, for use as an overcoat layer of an ultraviolet erasable programmable rad-only memory, by plasma chemical vapor deposition using a SiH₄ gas and a nitride gas under the control of microwave energy, said method comprising the steps of:
    establishing a correlationship between the flow rate of the SiH₄ gas and the microwave energy in view of an internal stress of the plasma silicon nitride film and an ultraviolet absorbed dose of the plasma silicon nitride film; and
    controlling levels of the flow rate of the SiH₄ gas and the microwave energy for forming the plasma silicon nitride film so that the plasma silicon nitride film will fulfill both an allowable range of internal stresses of a range from $-3.0 \times 10^9$ to $-7.0 \times 10^9$ dyn/cm² for the plasma silicon nitride film and an allowable range of ultraviolet absorbed doses of the plasma silicon nitride film.

8. A method according to claim 7, wherein said allowable range of ultraviolet absorbed doses is at most 0.7 abs/1000Å.

9. A method of determining conditions for the growth of a silicon nitride film in a plasma generated with SiH₄ and nitride gases by the application of high-frequency electric energy, comprising the steps of:
    establishing an allowable range of ultraviolet radiation absorption rates of the silicon nitride film, said allowable range at most being 0.7 abs/1000Å; and
    establishing an allowable range of inner stresses of the silicon nitride film; and
    controlling levels of both the flow rate of the SiH₄ gas and the high-frequency electric energy to cause the silicon nitride film to satisfy said allowable range of ultraviolet radiation absorption rates and said allowable range of inner stresses.

10. A method according to claim 9, further including the step of controlling the levels of both the flow rate of the SiH$_4$ gas and the high-frequency electric energy to cause the silicon nitride film to satisfy said allowable range of ultraviolet radiation absorption rates with a wide margin and said allowable range of inner stresses with a wide margin.

11. A method of manufacturing a semiconductor device having an overcoat layer in the form of a silicon nitride film in a plasma generated with SiH$_4$ and nitride gases by the application of high frequency electric energy, comprising the steps of:
 establishing an allowable range of ultraviolet radiation absorption rates of the silicon nitride film, said allowable range of ultraviolet radiation rates being at most 0.7 abs/1000Å;
 establishing an allowable range of inner stresses of the silicon nitride film;
 determining levels of both the flow rate of the SiH$_4$ gas the high-frequency electric energy to cause the silicon nitride film to satisfy said allowable range of ultraviolet radiation absorption rates and said allowable range of inner stresses; and
 supplying the SiH$_4$ gas at the determined flow rate and applying the high-frequency electric power at the determined level to generate a plasma for forming the silicon nitride film therein.

12. A method according to claim 11, further including the step of determining the levels of both the flow rate of the SiH$_4$ gas the high-frequency electric energy to cause the silicon nitride film to satisfy said allowable range of ultraviolet radiation absorption rates with a wide margin and said allowable range of inner stresses with a wide margin.

13. A method of determining a condition for forming a plasma silicon nitride film, for use as an overcoat layer of an ultraviolet erasable programmable read-only memory, by plasma chemical vapor deposition using a SiH$_4$ gas and a nitride gas under the control of microwave energy, said method comprising the steps of:
 establishing a correlationship between the flow rate of the SiH$_4$ gas and the microwave energy in view of an internal stress of the plasma silicon nitride film and an ultraviolet absorbed dose of the plasma silicon nitride film; and
 controlling levels of the flow rate of the SiH$_4$ gas and the microwave energy for forming the plasma silicon nitride film so that the plasma silicon nitride film will fulfill both an allowable range of internal stresses of the plasma silicon nitride film and an allowable range of ultraviolet absorbed doses at the most 0.7 abs/1000Å for the plasma nitride film.

* * * * *